United States Patent
Ho et al.

(10) Patent No.: US 7,945,404 B2
(45) Date of Patent: May 17, 2011

(54) CLOCK JITTER MEASUREMENT CIRCUIT AND INTEGRATED CIRCUIT HAVING THE SAME

(75) Inventors: Jung-Chi Ho, Taipei County (TW); Sheng-Bin Lin, Changhua County (TW); Yeong-Jar Chang, Taichung County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 508 days.

(21) Appl. No.: 12/108,796

(22) Filed: Apr. 24, 2008

(65) Prior Publication Data
US 2009/0271133 A1    Oct. 29, 2009

(51) Int. Cl.
*G01R 23/00* (2006.01)
*G06F 19/00* (2006.01)

(52) U.S. Cl. ............................... 702/69; 702/79
(58) Field of Classification Search .................... 702/69, 702/79; 714/733, 798
See application file for complete search history.

(56) References Cited

U.S. PATENT DOCUMENTS

| | | | |
|---|---|---|---|
| 5,663,991 A | 9/1997 | Kelkar et al. | |
| 6,185,510 B1 | 2/2001 | Inoue | |
| 7,308,372 B2* | 12/2007 | Rifani et al. | 702/69 |
| 7,603,602 B2* | 10/2009 | Chang | 714/733 |

* cited by examiner

*Primary Examiner* — Bryan Bui
(74) *Attorney, Agent, or Firm* — Winston Hsu; Scott Margo

(57) ABSTRACT

Provided is a measurement circuit for measuring a jitter of a clock signal. Delay elements delay the clock signal into delayed clock signal. Latches latch the delayed clock signals to indicate whether transition edges of the clock signal is within a window value which is corresponding to delays of the delay elements. Based on the latch result from the latches, a finite state machine generates control signals for controlling the delay elements. If the latch result indicates that the transition edges of the clock signal is not within the window value, the control signals adjust the delays of the delay elements and the window value. The jitter of the clock signal is measured based on the delays of the delay elements and the window value.

19 Claims, 14 Drawing Sheets

CLOCK JITTER MEASUREMENT CIRCUIT AND INTEGRATED CIRCUIT HAVING THE SAME

BACKGROUND OF THE INVENTION

1. Field of Invention

The present invention relates to a jitter measurement circuit and an integrated circuit applying the same. More particularly, the present invention relates to a jitter measurement circuit built-in an ASIC, for measuring jitter value of a clock generated from a clock generator in the ASIC.

2. Description of Related Art

In integrated circuits, such as data transmission circuits, PLL (Phase Locked Loop) is widely used for clock generation. For instance, PLL circuits are utilized in many applications to provide an output signal that is of the same phase and frequency as an input reference signal. In addition, PLL are widely used in Application Specific Integrated Circuit (ASIC) chips for clock synchronization and multiplication to facilitate high speed chip to chip communication. However, PLL have some small amount of error associated with their operation. Because of the high degree of precision required by many of today's advanced digital systems, jitter parameters of output clocks or reference clocks generated from PLL or CDR (Clock Data Recovery) circuits are important for circuit designers and manufacturers. The clock signals should be prevented from being affected by clock skews due to jitters. In particular, when the frequencies of the clock signals are high, the influences of the jitters to these clock signals should be monitored and prevented so that the relevant integrated circuit can be normally operated.

PLL or CDR produces some amount of undesirable error (or jitter) in its output clock whose magnitude is usually small and difficult to measure. PLL clock error or jitter plays an especially important role when dealing with high speed communication between ASIC chips. Therefore, accurate knowledge of PLL jitter is critical in avoiding system failures.

Unfortunately, the ability to accurately measure output clock error has become increasingly difficult because production testers used for ASIC tests cannot accurately measure jitter if the PLL errors are reduced to a point. Furthermore, even though certain PLL parameters can be measured and tested, there exists no guarantee that a PLL could still exhibit jitter above its specification.

FIG. 1 shows an IC having PLL jitter measurement in the related art. With reference to FIG. 1, an integrated circuit 10 has a first PLL 11 and a second PLL 12. The first PLL 11 generates a reception clock signal rclk for sampling an input signal. The second PLL 12 generates a transmission clock signal tclk for synchronizing with an output signal. A first clock pulse CK1 and a second clock pulse CK2 are sent from the outside of the integrated circuit 10 to the first PLL 11 and the second PLL 12, respectively. The reception clock signal rclk is distributed to a functional circuit such as a logic circuit (not shown) of the integrated circuit 10. The transmission clock signal tclk is used to send transmission data of a transmission functional circuit 18 that has a transmission function to the outside of the integrated circuit 10.

The integrated circuit 10 has a PLL jitter measurement functional circuit 13 that measures a jitter of the reception clock signal rclk. The PLL jitter measurement functional circuit 13 receives transmission data from the transmission functional circuit 18. The PLL jitter measurement functional circuit 13 selectively transmits reception data in synchronization with the reception clock signal rclk or transmission data received from the transmission functional circuit 18 in synchronization with the transmission clock signal tclk.

The PLL jitter measurement functional circuit 13 has a sampling portion 14, a delaying circuit 15, a selecting circuit 16, and an outputting portion 17. The sampling portion 14 samples the reception data (as an input signal IN) with the reception clock signal rclk, and obtains a sampled signal. The delaying circuit 15 delays the sampled signal, and sends the delayed sampled signal to the selecting circuit 16. In the jitter measuring mode, the selecting circuit 16 outputs the delayed sampled signal to the outputting portion 17. In the normal mode, the selecting circuit 16 outputs the transmission data received from the transmission functional circuit 18 to the outputting portion 17. The outputting portion 17 outputs the transmission data as an output signal OUT in synchronization with the transmission clock signal tclk.

When a conventional IC tester 19 is connected to the test input terminal and the test output terminal of the IC 10, the PLL jitter measurement functional circuit 13 is enabled to measure jitter parameters of the clock signals rclk and tclk. The clock signals rclk and tclk are sampled and the number of the expectation errors are counted to determine the jitters.

Referring now to FIG. 2, another conventional jitter measurement circuit 20 is shown. To begin jitter measurement, the reset signal 24 is pull low to allow the reference clock 22 and the measured clock signal 26 to the applied to the jitter measurement circuit 20. The jitter measurement circuit 20 measures the jitter defined as the delay between the transition edge of the reference clock 22 and the measured clock signal 26. The jitter measurement circuit 20 functions by sorting transition edges of the measured clock signal 26 into one of several possible time slices wherein each time slice represents a different time lag of the measured clock signal 26 behind the reference clock 22.

The jitter measurement circuit 20 includes a delay stage 21; a latch stage 23; and a four-bit word output 28. The delay stage 21 delays the reference clock 22 into clock signals 22a~22d. The latches in the latch stage 23 captures value of the measured clock 26 (either 1 or 0) at a specified transition edge of one of the various delay clock signals and outputs the captured value over a corresponding output line OUTA, OUTB, OUTC and OUTD. In other words, the latch stage 23 captures the value of the measured clock at a specific point in time to determine whether the transition edge occurred. If the captured value is 0, then the transition edge of the measured signal has yet to occur. If the captured value is 1, then the transition edge of the measured signal has already occurred. Thus, a four bit word 28 is generated that contains information regarding when a rising transition edge of the measured clock occurred. The four bit word 28 indicates the amount of jitter between the rising edge of the reference and measured clocks.

Therefore, it needs a new structure jitter measurement circuit which may provide advantages over the related arts.

SUMMARY OF THE INVENTION

The invention provides a built-in jitter measurement circuit to measure peak to peak period jitter of a clock under test. Because the jitter measurement circuit is on-chip, the high-end Automated Test Equipment (ATE) cost is saved.

The invention provides a built-in jitter measurement circuit, wherein even if suffered by variation tolerance, more accurate jitter measurement result may be achieved by adaptive delay line and jitter window tuning.

The invention provides a built-in jitter measurement circuit with self debug mode, so the calibration/debug time is reduced and the time-to-market is also reduced.

The invention provides a built-in jitter measurement circuit with additional delay units in the analog part to provide retiming and design flexibility and to balance possible process variation.

The invention provides a built-in jitter measurement circuit, wherein FSM in the digital part has quite a few states, so easy scheme on CDL and jitter window tuning in analog part is achieved.

One example of the invention provides a measurement circuit within an integrated circuit, for measuring an error value of a clock signal under test. The measurement circuit has: a first delay element, for delaying the clock signal under test to generate a first delayed clock signal; a second delay element, for delaying the clock signal under test to generate a second delayed clock signal; a condition indication element, coupled to the first and second delay elements, for indicating whether the error value of the clock signal under test is within a window value, the window value being corresponding to delays of the first and second delay elements; and a state machine, coupled to the condition indication element, for generating first and second control signals based on an indication signal from the condition indication element, the first and second control signals being for controlling the first and second delay elements. If the indication signal indicates that the error value of the clock signal under test is not within the window value, the first and second control signals adjust the delays of the first and the second delay elements and the window value. The error value of the clock signal under test is measured based on the delays of the first and the second delay elements and the window value.

Another example of the invention provides an integrated circuit, including: a clock generation circuit, for generating a clock signal under test; and a measurement circuit, coupled to the clock generation circuit, for measuring an error value of the clock signal under test. The measurement circuit includes: a delay stage, for delaying the clock signal under test to generate a plurality of delayed clock signals; a condition indication element, for receiving the plurality of delay clock signals from the delay stage to indicating whether the error value of the clock signal under test is within a window value, the window value being corresponding to delays of the delay stage; and a state machine, coupled to the condition indication element, for generating a control signal based on an indication signal from the condition indication element, the control signal being for controlling the delay stage. If the indication signal indicates that the error value of the clock signal under test is not within the window value, the control signal adjust the delays of the delay stage and the window value, so that the error value of the clock signal under test is to be within the window value, and the error value of the clock signal under test is measured based on the delays of the delay stage and the window value.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
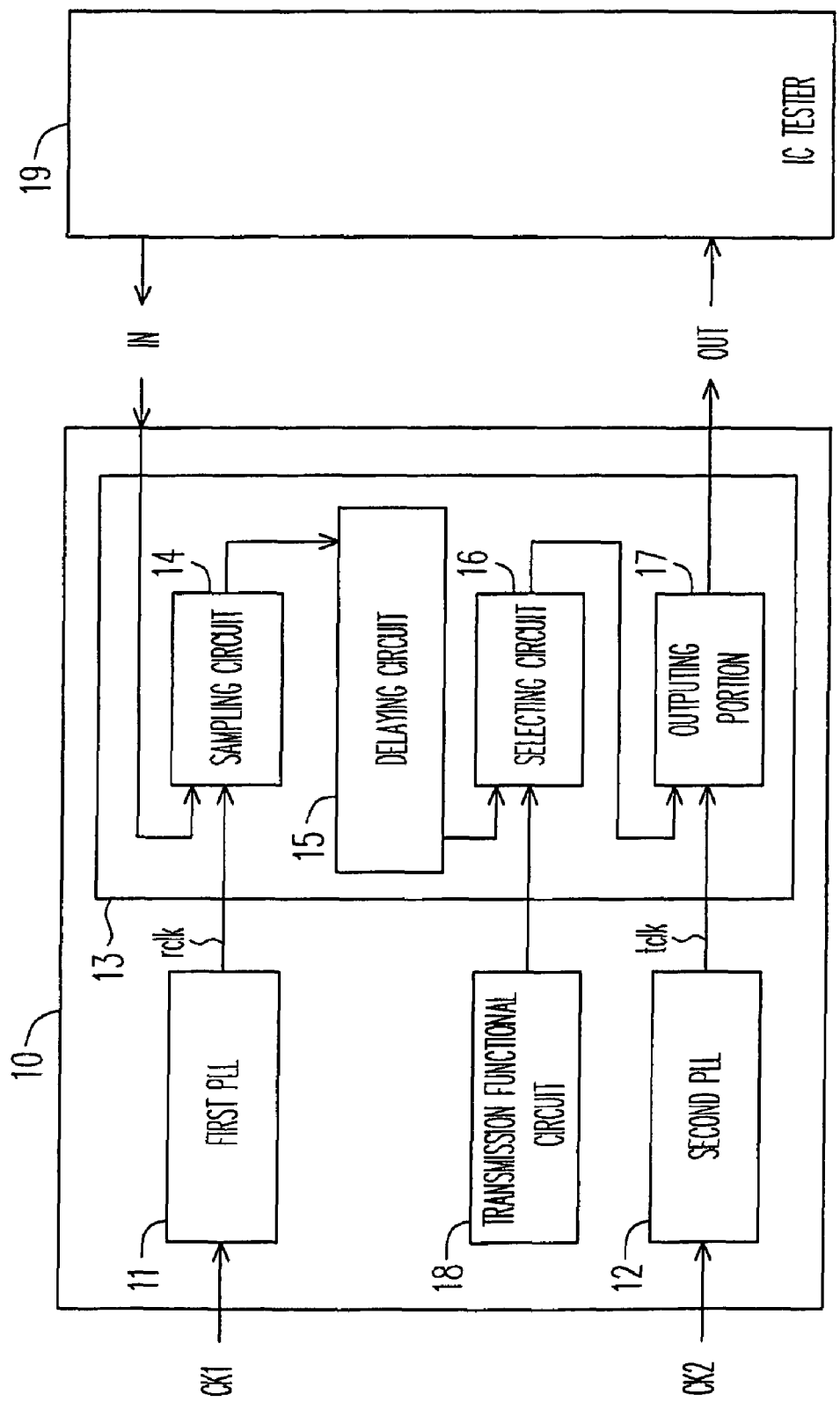
FIG. 1 shows an IC having PLL jitter measurement in the related art.
Figure 2:
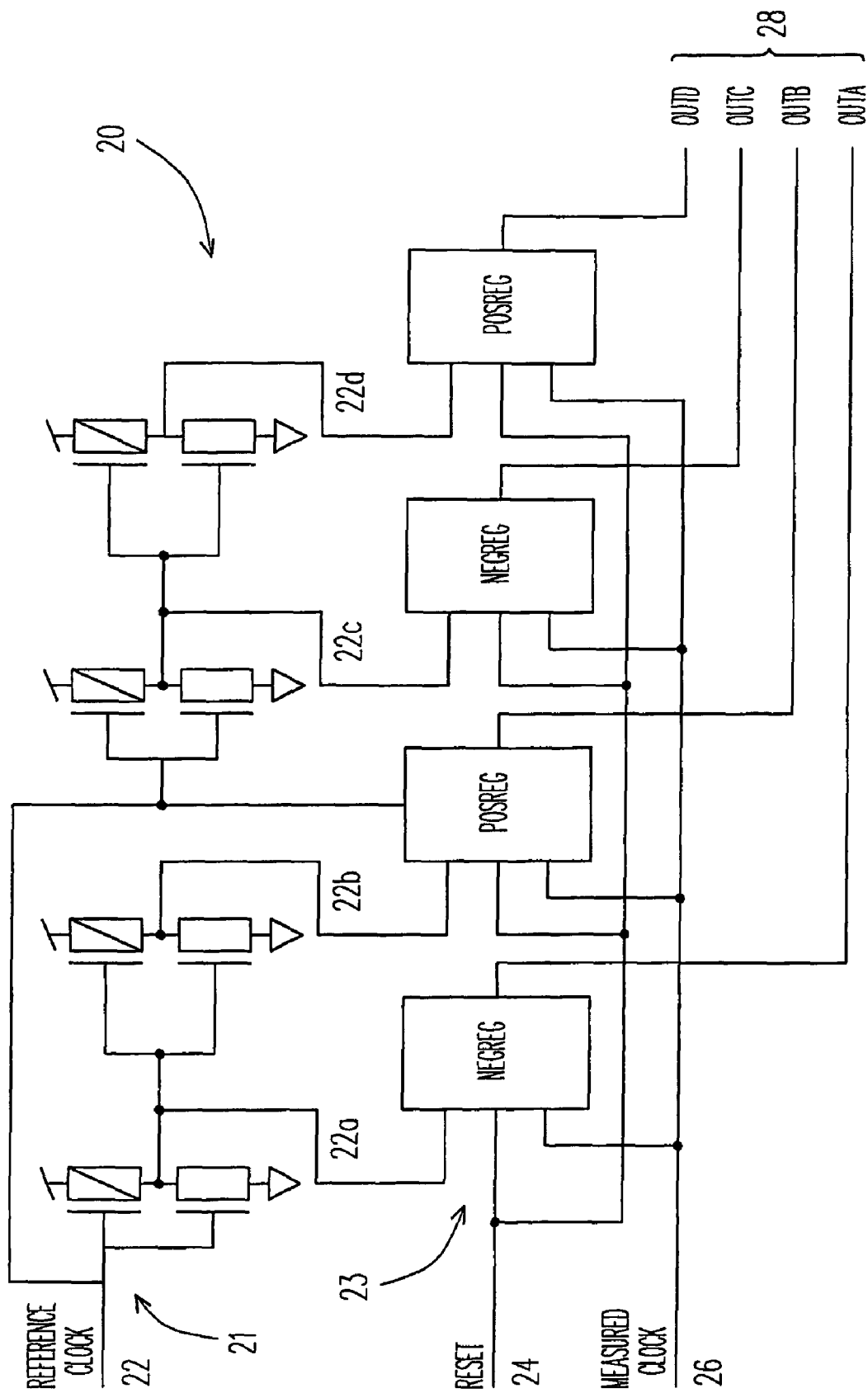
FIG. 2 shows another conventional jitter measurement circuit 20.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 3:
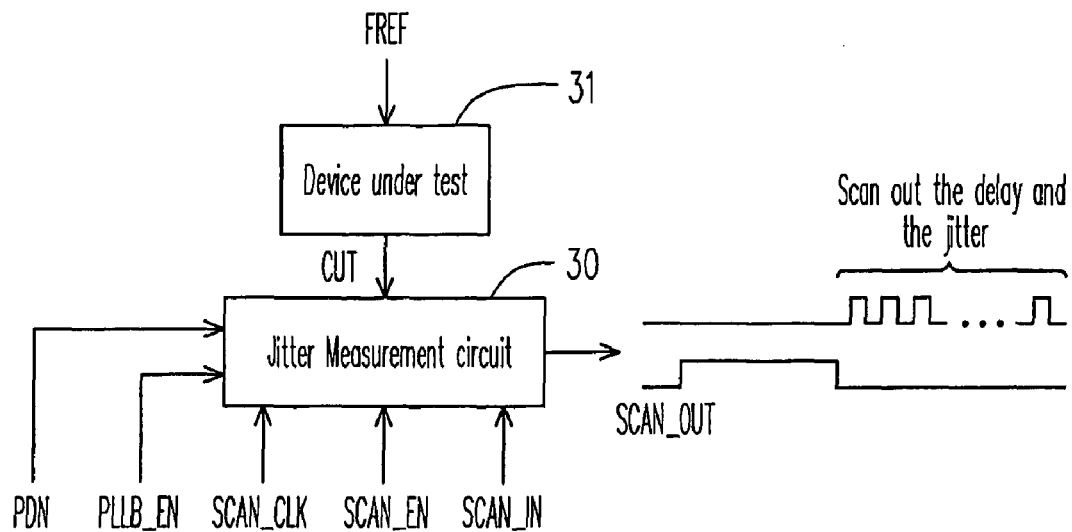
FIG. 3 shows an ASIC integrated with a built-in jitter measurement circuit 30 according to a first embodiment of the invention.

FIG. 3 shows an ASIC integrated with a built-in jitter measurement circuit 30 according to a first embodiment of the invention. The ASIC has the built-in jitter measurement circuit 30 and a device under test 31. The device under test 31 may be for example but not limited by, PLL or CDR which may generate a clock CUT which is under test. FREF is a reference clock signal input to the device under test 31, so that the device under test 31 may generate the clock CUT.

The jitter measurement circuit 30 has pins for receiving signals PDN, PLLB_EN, SCAN_CLK, SCAN_EN and SCAN_IN and a pin for outputting signal SCAN_OUT.

Figure 4:
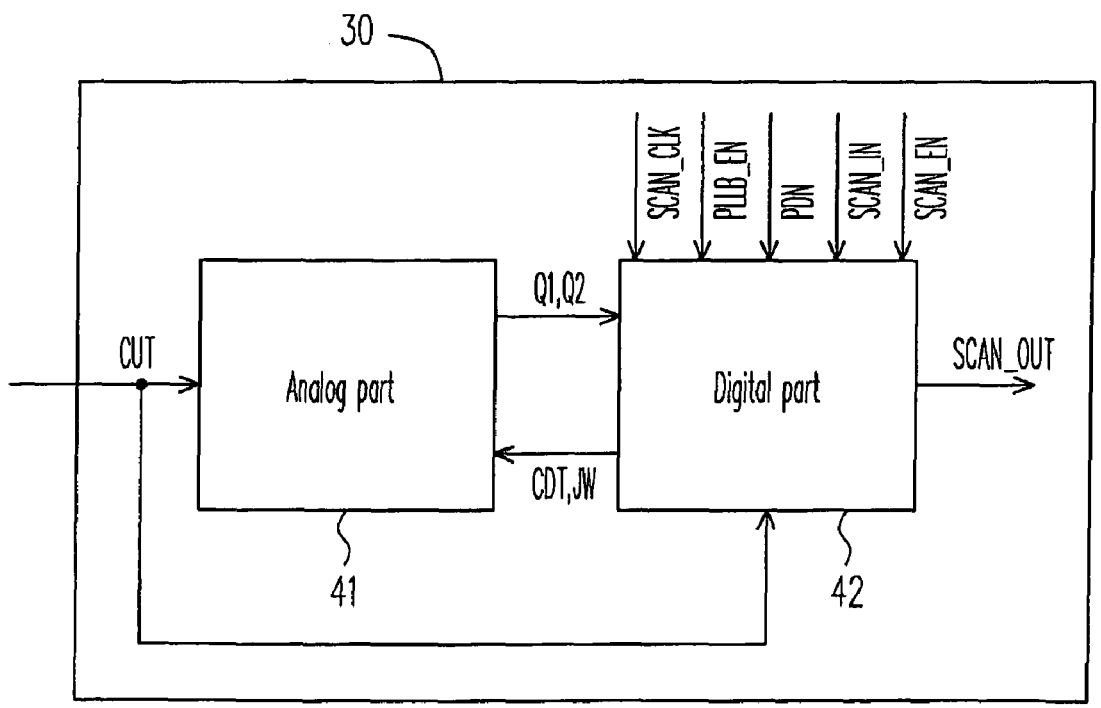
FIG. 4 shows a functional block diagram of the jitter measurement circuit 30, which includes an analog part 41 and a digital part 42.

FIG. 4 shows a functional block diagram of the jitter measurement circuit 30, which includes an analog part 41 and a digital part 42. The analog part 41 generates detection results Q1 and Q2 to the digital part 42. The digital part 42 generates the output signal SCAN_OUT which indicates the jitter measurement result. Further, the digital part 42 adapted control the signals CDL and JW of analog part 41.

Figure 5:
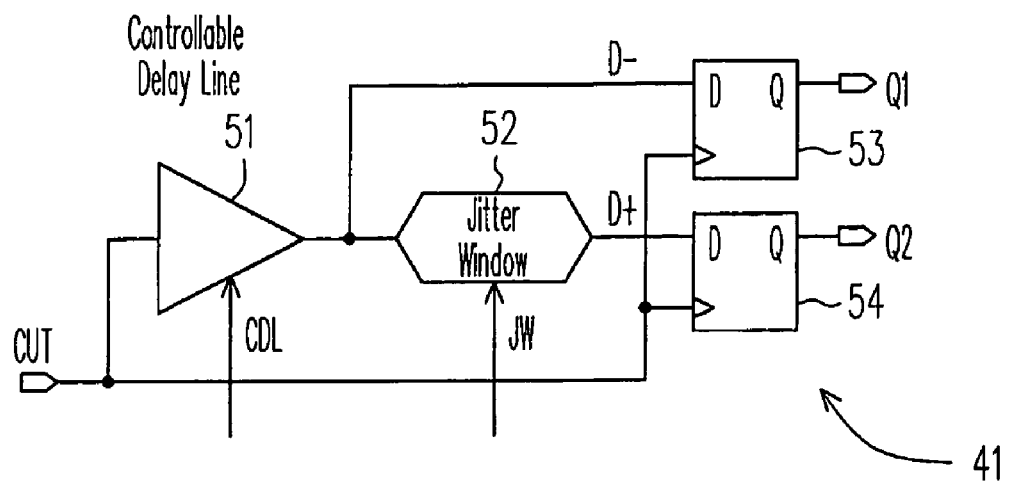
FIG. 5 shows the functional block diagram of the analog part 41 in FIG. 4.

FIG. 5 shows the functional block diagram of the analog part 41 in FIG. 4. As shown in FIG. 5, the analog part 41 includes a controllable delay line 51, a jitter window 52 and flip-flops 53, 54.

The controllable delay line 51 is for example, a 9 bit controllable delay line including 4 bits multiplexer type CDL and 5 bits jitter window. The controllable delay line 51 delays the clock CUT based on the control signal CDL of digital part. The delay amount by the controllable delay line 51 is controllable by the control signal CDL. The output signal of the controllable delay line 51 is input to the FF 53 and the jitter window 52. For example, when the control signal CDL is 238 (in decimal value, not in binary value), the delay amount by the controllable delay line 51 is 994 ps.

The jitter window 52 is for example a 5 bit controllable delay line (i.e. the control signal JW has 5 bits). The jitter window 52 delays the output signal from the controllable delay line 51 based on the control signal JW of digital part. The delay amount by the jitter window 52 is controllable by the control signal JW. The output signal of the jitter window 52 is input to the FF 54. For example, when the control signal JW is 13 (in decimal value, not in binary value), the delay amount by the jitter window 52 is 68.9 ps.

The FF 53 has: a data input terminal for receiving the output signal of the controllable delay line 51; a clock input terminal for receiving the clock CUT and an output signal for outputting the detection signal Q1. Similarly, the FF 54 has: a data input terminal for receiving the output signal of the jitter window; a clock input terminal for receiving the clock CUT and an output signal for outputting the detection signal Q2.

Figure 6:
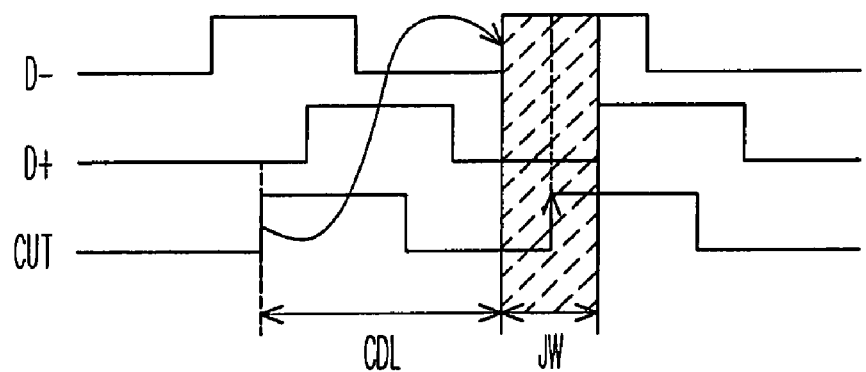
FIG. 6 shows waveforms and states of the analog part in FIG. 4.

FIG. 6 shows waveforms of the clock CUT, the output signal of the controllable delay line 51 (D−) and the output signal of the jitter window (D+). FIG. 6 further shows state condition corresponding to the detection signals Q1 and Q2.

In Fast state, the signals Q1 and Q2 are 1,1, respectively. In this Fast condition, the controllable delay line 51 should be tuned slower i.e. the delay amount of the controllable delay line 51 should be increased by digital part. Increasing delay in the controllable delay line 51 can push JW toward right in FIG. 6, which may cause rising edges of the clock CUT fall in jitter window.

Similarly, In Slow state, the signals Q1 and Q2 are 0,0, respectively. In this Slow condition, the controllable delay line 51 should be tuned faster, i.e. the delay amount of the controllable delay line 51 should be decreased by digital part. Decreasing delay in the controllable delay line 51 can push JW toward left in FIG. 6, which may cause rising edges of the clock CUT fall in jitter window.

In Lock state, the rising edge of the clock CUT is in the shadow region; The signals Q1 and Q2 are 1,0 respectively and the peak to peak period jitter of the clock CUT is almost the width of the jitter window. In other words, in lock state, the jitter of the clock CUT is detected, which is represented by the following expression:

$$\text{Jitter} = T \times \frac{JW}{CDL + \frac{1}{2}JW}.$$

The above equation describes how to calculate peak to peak period jitter. T refers to a clock cycle of the clock CUT. For example, the clock CUT is 1 GHz (ideal period T=1000 ps) and jittered clock is distributed from 970 ps to 1030 ps (i.e. peak to peak jitter is 60 ps). Under lock state, the control signals CDL and JW are 238 and 24 respectively. From lookup table, CDL equal to 238 means that the clock CUT is delayed by 969 ps and JW equal to 24 means that the width of the jitter window is 63 ps. From the above equation, the calculated maximum peak to peak jitter is approximately 63 ps, which is close to the actual peak to peak jitter of the clock CUT.

Further, variation tolerance can be described in the above equation, too. PVT variations can cause the delay values of the controllable delay line 51 and the jitter window 52 to drift. Because the controllable delay line 51 and the jitter window 52 include controllable delay lines, drift in the delay values of the controllable delay line 51 and the jitter window 52 will move in the same direction. From the above equation, the amount of drift will be cancelled due to division. From above example, assume 50% variation in CDL and JW. The new CDL value will become 1453.5 ps and the new JW value will become 94.5 ps. From the above equation, the new calculated peak to peak period jitter is equal to 61 ps which is also close to the actual peak to peak jitter of the clock CUT. The above equation reveal that a large amount variation in CDL and JW results in a small amount variation in calculated peak to peak period jitter.

Figure 7:
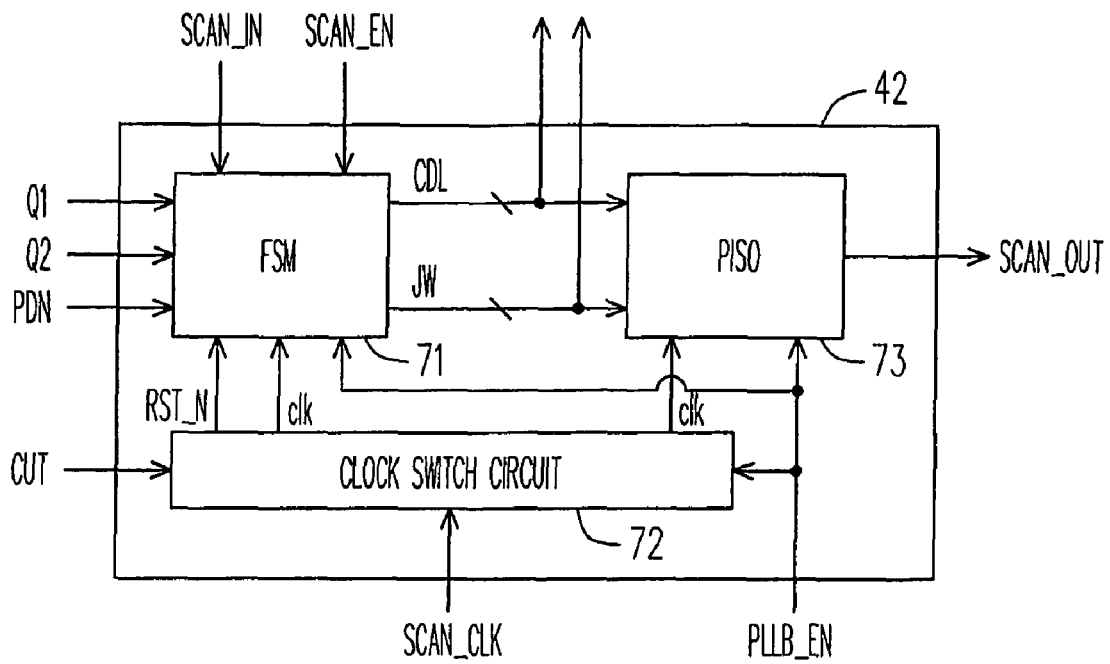
FIG. 7 shows the functional block diagram of the digital part 42.

FIG. 7 shows the functional block diagram of the digital part 42. As shown in FIG. 7, the digital part 42 includes a FSM (finite state machine) 71, a clock switch circuit 72 and a PISO (Parallel In Serial Out) circuit 73.

Figure 8:
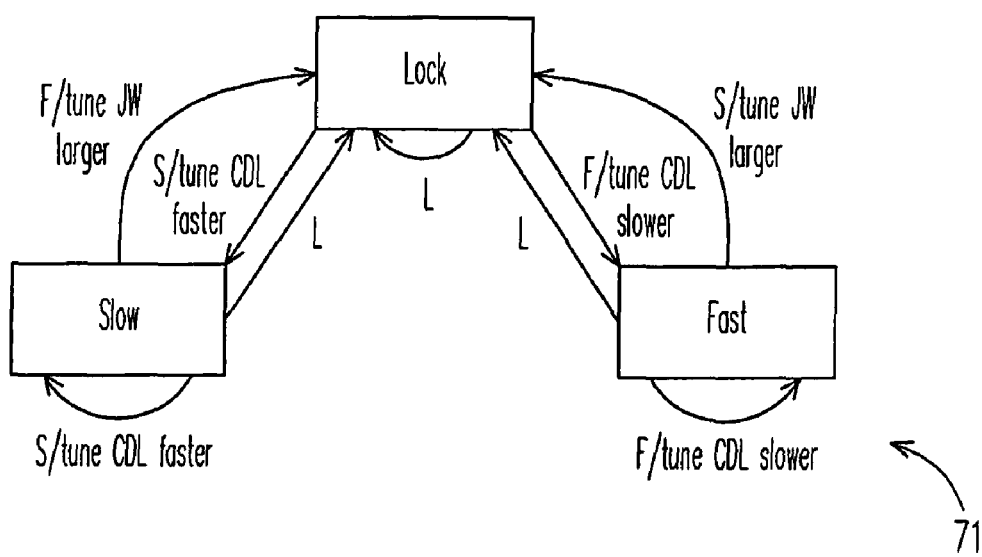
FIG. 8 shows state transition diagram of the FSM 71 in the digital part 42.

The FSM 71 generates and adjusts the control signals CDL and JW in response to the detection signals Q1 and Q2 from the analog part 41. The FSM 71 is reset by the signal RST_N if the signal PLLB_EN is transited from L to H. FIG. 8 shows state transition diagram of the FSM 71. FSM 71 needs three states (Fast state, Lock state and Slow state), which may provide easy scheme on CDL and JW tuning in the analog part 41. The control signals CDL and JW are input to the analog part 41 for controlling the controllable delay line 51 and the jitter window 52. The control signals CDL and JW are also output to the PISO circuit 73 to be serial output via the pin SCAN_OUT.

Now please refer to FIG. 8. In the lock state, if the new detection signals Q1 and Q2 indicate F (i.e. Q1 and Q2 are both 1), the next state of the FSM 71 jumps to the Fast state, which will tune the control signal CDL slower. In the lock state, if the new detection signals Q1 and Q2 indicate L (i.e. Q1 and Q2 are 1 and 0, respectively), the next state of the FSM 71 maintains at the Lock state, which means the jitter measurement is locked. In the lock state, if the new detection signals Q1 and Q2 indicate S (i.e. Q1 and Q2 are both 0), the next state of the FSM 71 jumps to the Slow state, which will tune the control signal CDL faster.

In the Fast state, if the new detection signals Q1 and Q2 indicate F (i.e. Q1 and Q2 are both 1), the next state of the FSM 71 jumps to the Fast state, which will tune again the control signal CDL slower. In the Fast state, if the new detection signals Q1 and Q2 indicate L (i.e. Q1 and Q2 are 1 and 0, respectively), the next state of the FSM 71 jumps to the Lock state, which means the jitter measurement is locked. In the Fast state, if the new detection signals Q1 and Q2 indicate S (i.e. Q1 and Q2 are both 0), the next state of the FSM 71 jumps to the Slow state, which will tune the control signal JW larger due to the window size insufficient.

In the Slow state, if the new detection signals Q1 and Q2 indicate F (i.e. Q1 and Q2 are both 1), the next state of the FSM 71 jumps to the Lock state, which will tune the control signal JW larger due to the window size insufficient. In the Slow state, if the new detection signals Q1 and Q2 indicate L (i.e. Q1 and Q2 are 1 and 0, respectively), the next state of the FSM 71 jumps to the Lock state, which means the jitter measurement is locked. In the Slow state, if the new detection signals Q1 and Q2 indicate S (i.e. Q1 and Q2 are both 0), the next state of the FSM 71 jumps to the Slow state, which will tune again the control signal CDL faster.

The Clock switch circuit 72 can generate an internal clock clk to the FSM 71 and the PISO circuit 73, based on the signal PLLB_EN. The internal clock clk is used as the operation clock of the FSM 71 and the PISO circuit 73. When the signal PLLB_EN is high, the internal clock clk will switch to the clock CUT (i.e. clk=CUT), so that the jitter measurement is enabled and continued. When the signal PLLB_EN is low, the internal clock clk will switch to the clock signal SCAN_CLK (i.e. clk=SCAN_CLK) and the PISO circuit 73 will shift out CDL and JW values in serial. The clock signal SCAN_CLK is a very low frequency clock signal, compared with the clock CUT. That is to say, when the signal PLLB_EN is low, the jitter measurement is disabled or completed and the jitter value of the clock CUT may be obtained based on the CDL and JW values shifted from the PISO circuit 73.

Figure 9A:
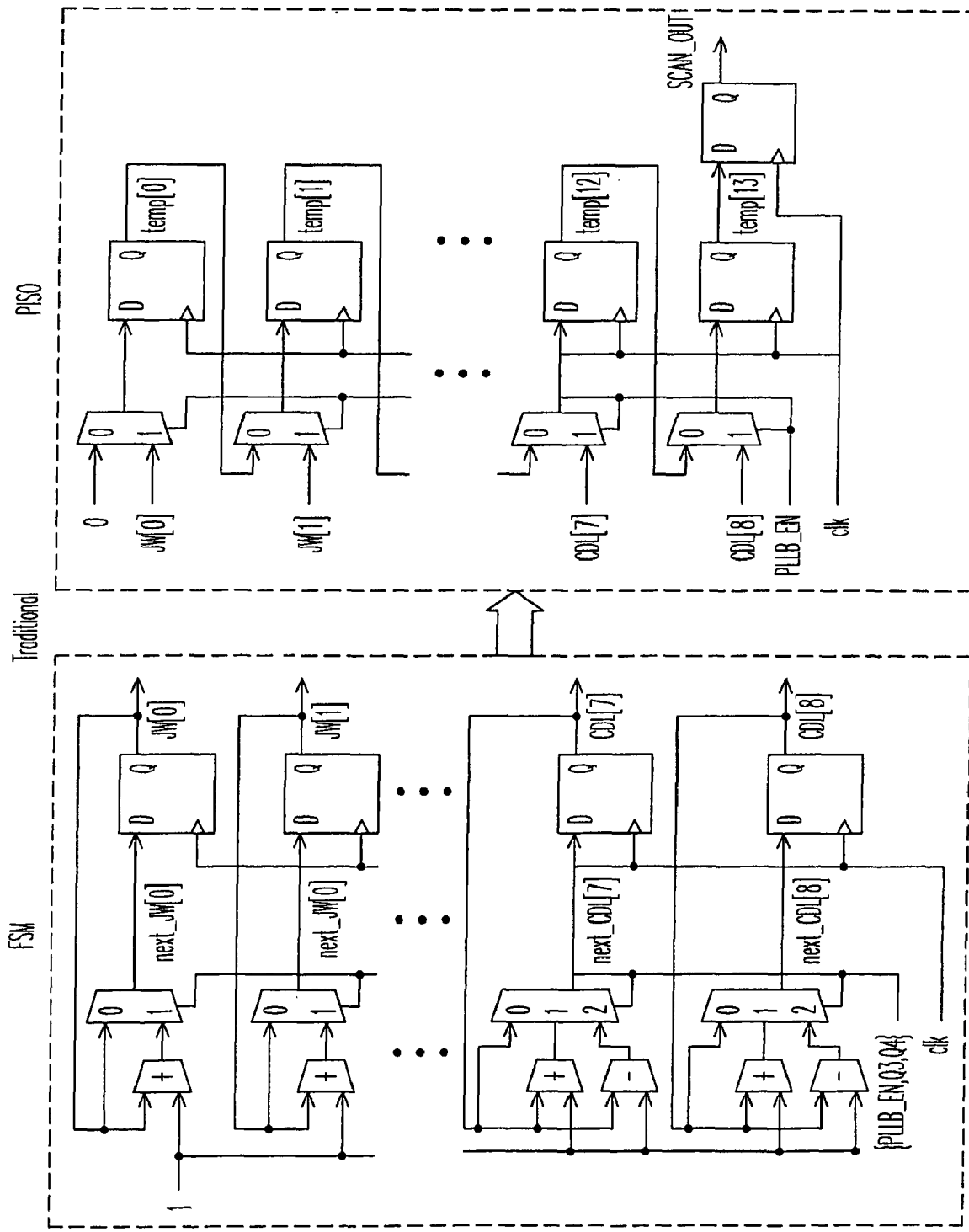
FIG. 9a shows a part of the FSM and the PISO circuit in the prior art.
Figure 9B:
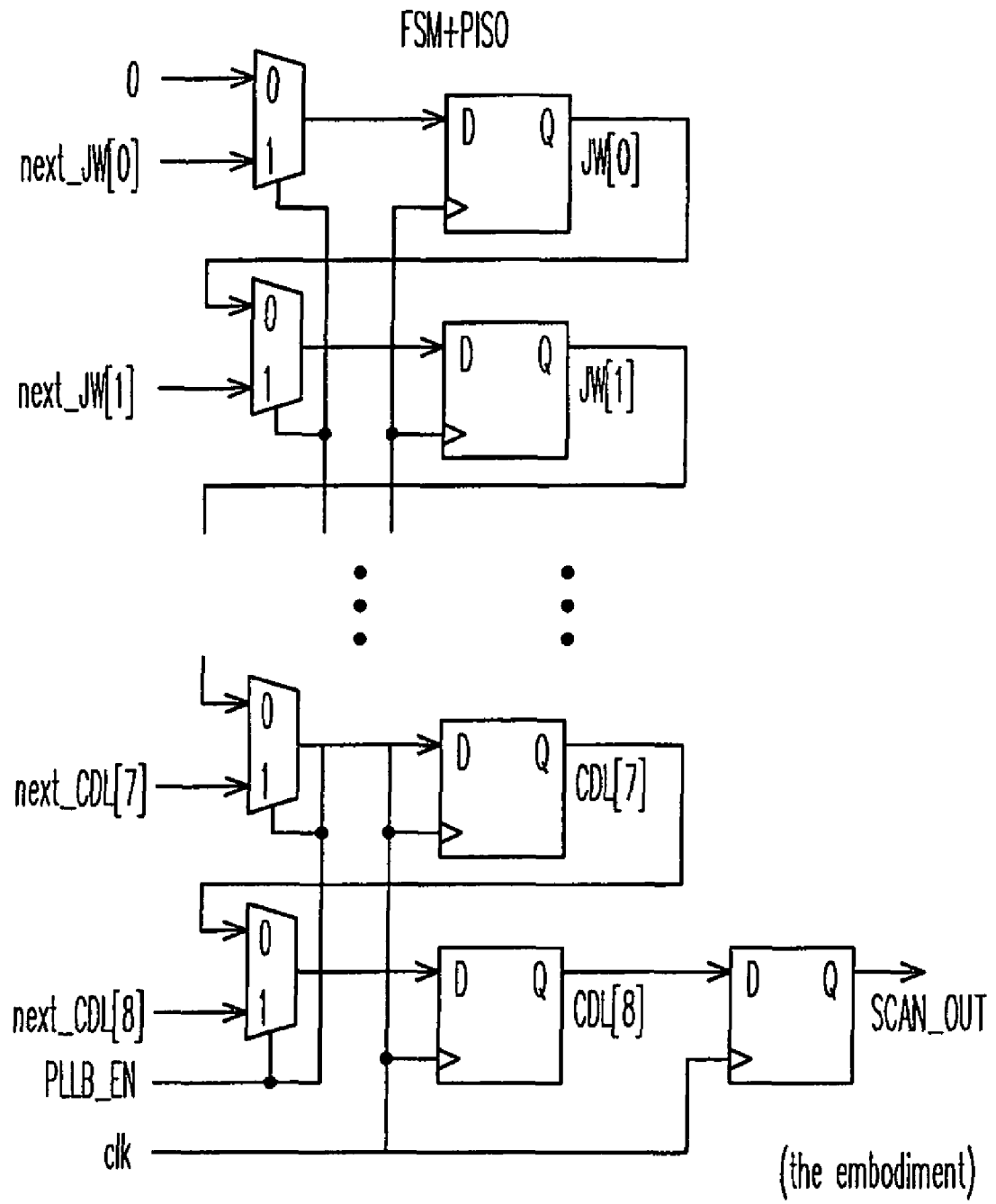
FIG. 9b shows a part of the FSM 71 and the PISO circuit 73 according to the embodiments of the invention.

In embodiments of the invention, in order to reduce circuit area, a part of the FSM 71 and the PISO circuit 73 are integrated. FIG. 9a shows a part of the FSM and the PISO circuit in the traditional method while FIG. 9b shows a part of the FSM 71 and the PISO circuit according to the embodiments of the invention. In FIG. 9a, Q3 and Q4 are corresponding to the detection signals Q1 and Q2, next_JW[n] and next_CDL [m] means new control signals JW and CDL from the FSM 71; temp[p] means temporary signals in DFFs of the conventional PISO circuit. n, m and p are natural numbers.

The traditional implementation in FIG. 9a needs a lot of registers to store data which is generated from FSM, and scans out data from the same registers. However, instead of storing data in the registers, the novel PISO implementation in FIG. 9b will scan out data (CDL and JW) immediately when data is generated from the FSM. The novel implementation in FIG. 9b can reduce 50% DFFs compare to the traditional implementation in FIG. 9a. Thus, this novel implementation has low area overhead. For example, if the control signals CDL and JW are 9 bits and 5 bits respectively, in the conventional architecture in FIG. 9a, the FSM has 14 DFFs and the PISO circuit has 14 DFFs (i.e. 28 DFFs are needed), while in the embodiments of the invention in FIG. 9b, 14 DFFs are enough.

Figure 10:
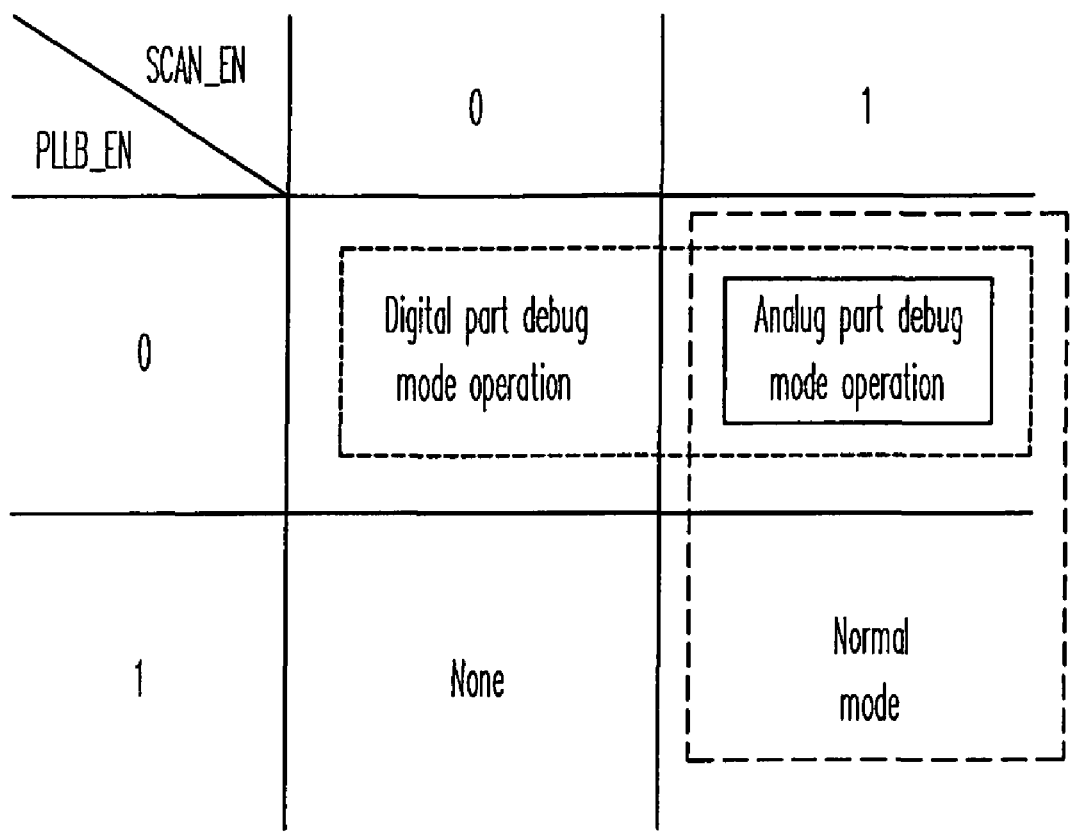
FIG. 10 shows the operation modes of the jitter measurement circuit 30 according to the embodiments of the invention.

Further, the jitter measurement circuit according to the embodiments of the invention can perform three operation modes by controlling the signals PLLB_EN and SCAN_EN. FIG. 10 shows the operation modes of the jitter measurement circuit 30 according to the embodiments of the invention. As shown in FIG. 10, the operation modes include normal mode operation, digital part debug mode operation and analog part debug mode operation. When the signals PLLB_EN and SCAN_EN are 0/1 and 1, respectively, the jitter measurement circuit 30 is under normal mode. When the signals PLLLB_EN and SCAN_EN are 0 and 1, respectively, the jitter measurement circuit 30 is under analog part debug mode. When the signals PLLB_EN and SCAN_EN are 0 and 0/1, respectively, the jitter measurement circuit 30 is under digital part debug mode.

In digital part debug mode operation and analog part debug mode operation, the control signals CDL and JW can be imported by the pin SCAN_IN under PLLB_EN and SCAN_EN are 0 and 1, respectively.

Figure 11A:
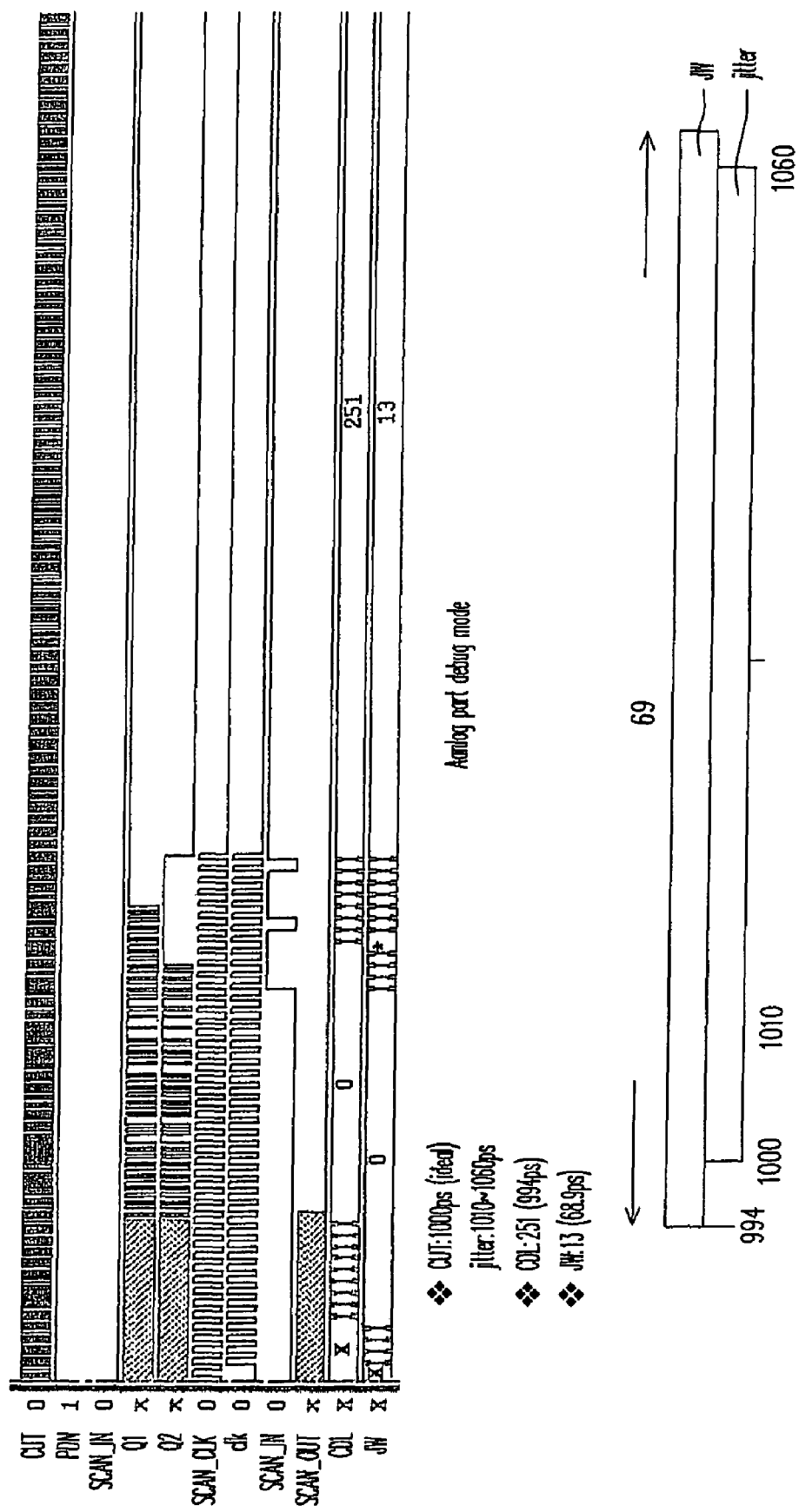
FIG. 11a and FIG. 11b show simulation result under the analog part debug mode.
Figure 11B:
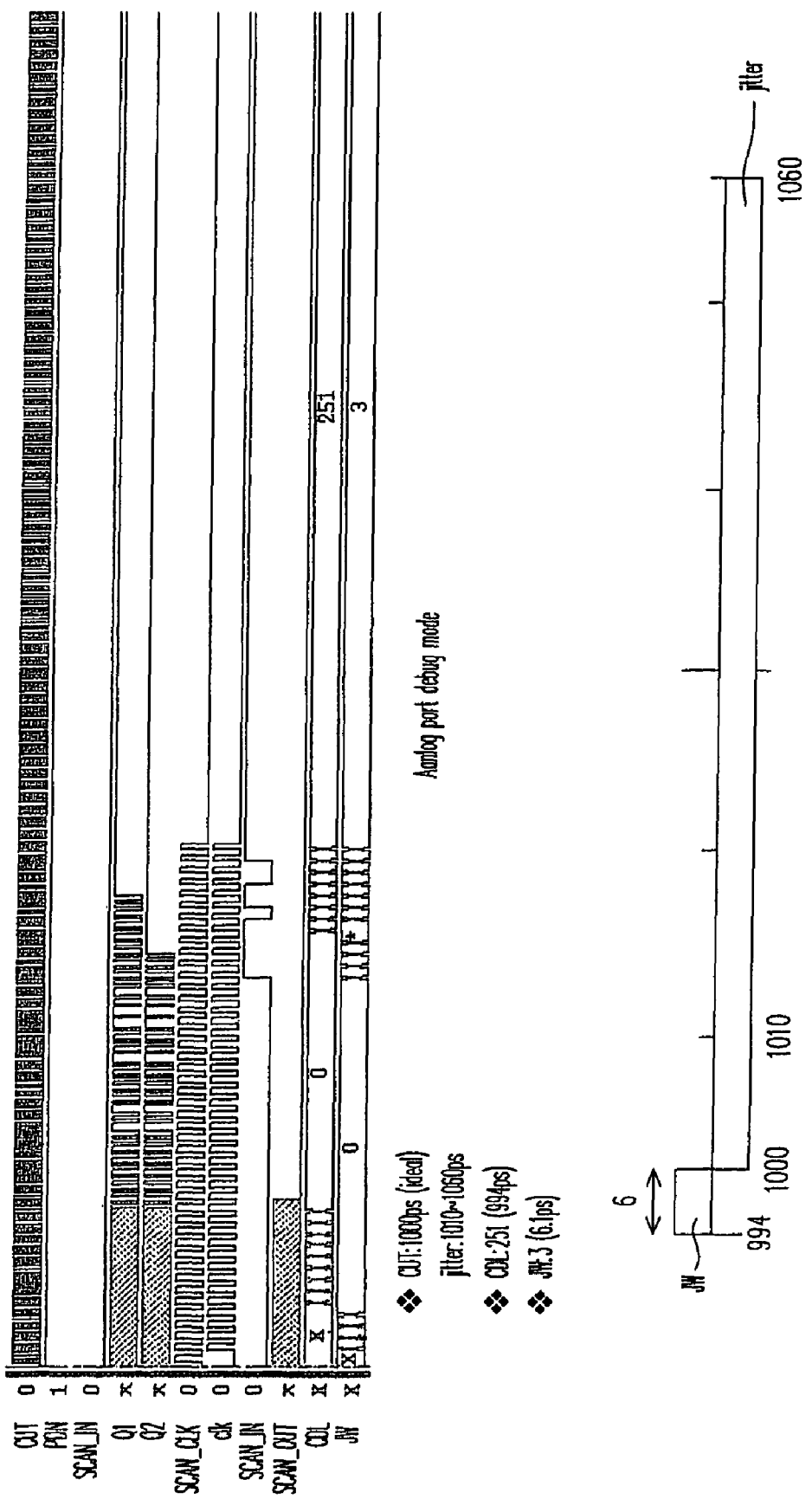

Under analog part debug mode, for example, the clock CUT is 1 GHz (T=1000 ps) and jittered clock is distributed from 1010 ps to 1060 ps. Therefore, the control signal CDL may be set as 253 (the control signal CDL equal to 253 means the clock CUT is delayed by 998 ps) and the control signal JW may be set as 24 (the control signal JW equal to 24 means that the width of the jitter window is 63 ps). 998 ps plus 63 ps is greater than 1060, so the transition edges of the clock CUT is within the jitter window and we can predict the state is "Lock" (i.e. Q1=1 and Q2=0). Slow state test and fast state test in analog part are similar to that of lock state. FIG. 11a and FIG. 11b show simulation result under the analog part debug mode. As shown in FIG. 11a, the clock jitter of the clock CUT is within the jitter window, so the state is lock. As shown in FIG. 11b, the clock jitter of the clock CUT is not within the jitter window, so the jitter window has to be tuned larger.

Under digital part debug mode, the FSM is to be tested. By digital part test, the FSM is verified as being in well work or not.

Figure 12A:
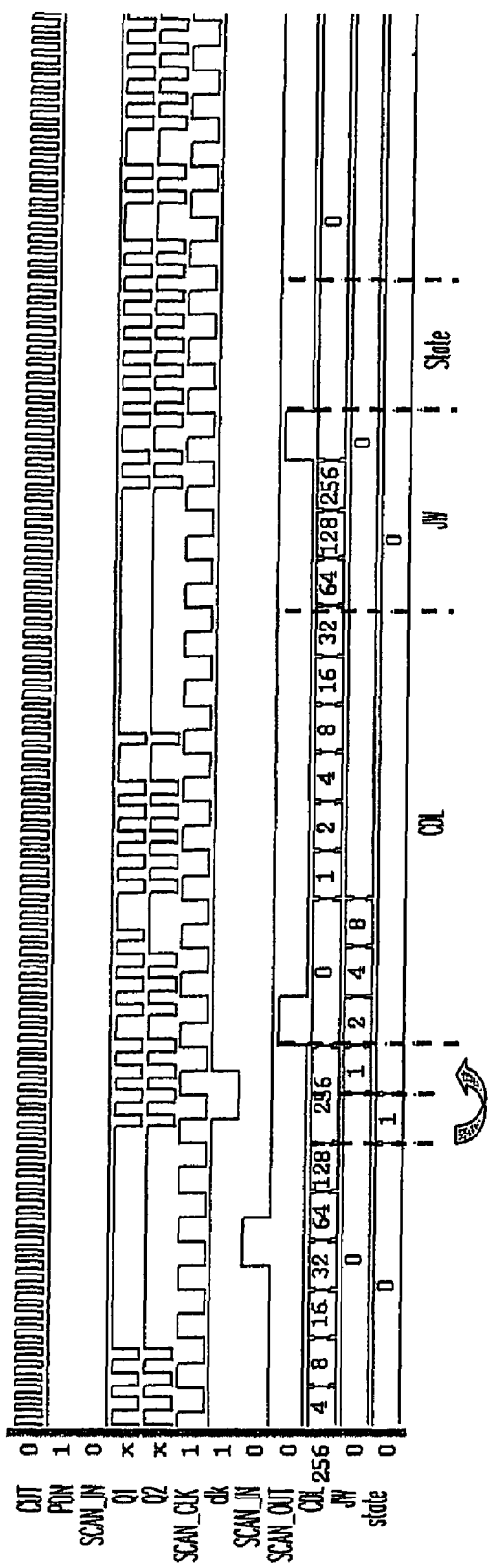
FIG. 12a and FIG. 12b show simulation result under the digital part debug mode.
Figure 12A:
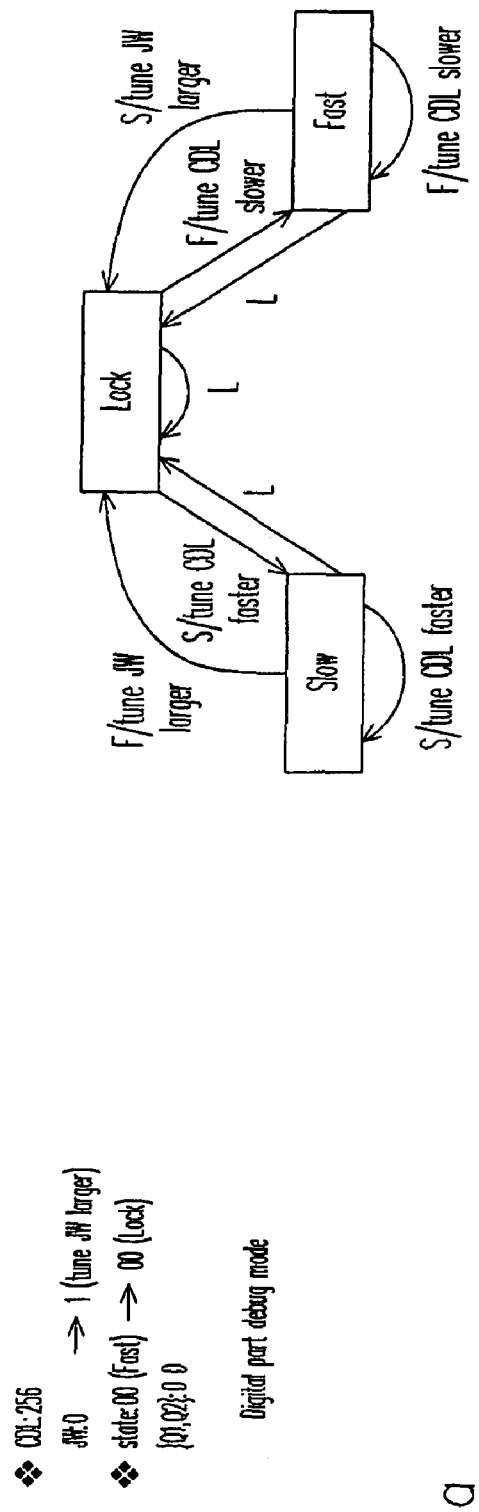

Under digital part debug mode, the values CDL, JW, the current state of the FSM (state), Q1 and Q2 are imported by the pin SCAN_IN under PLLB_EN and SCAN_EN are 0 and 1, respectively. When the values are imported completely, the signal SCAN_EN is set to low. After one clock cycle passes through, the signal SCAN_EN is set to high. For example, assume {CDL, JW, state, Q1, Q2} are set as {256, 4, 10, 0, 0}. State (1, 0) means Fast state. As state is in Fast state (1,0) and {Q1,Q2} is {0,0}, the state will be shift to Lock state (0,0) and JW will plus 1 normally. The CDL value remains unchanged. The state transition diagram of this case under digital part debug mode is shown in FIG. 12a.

Figure 12B:
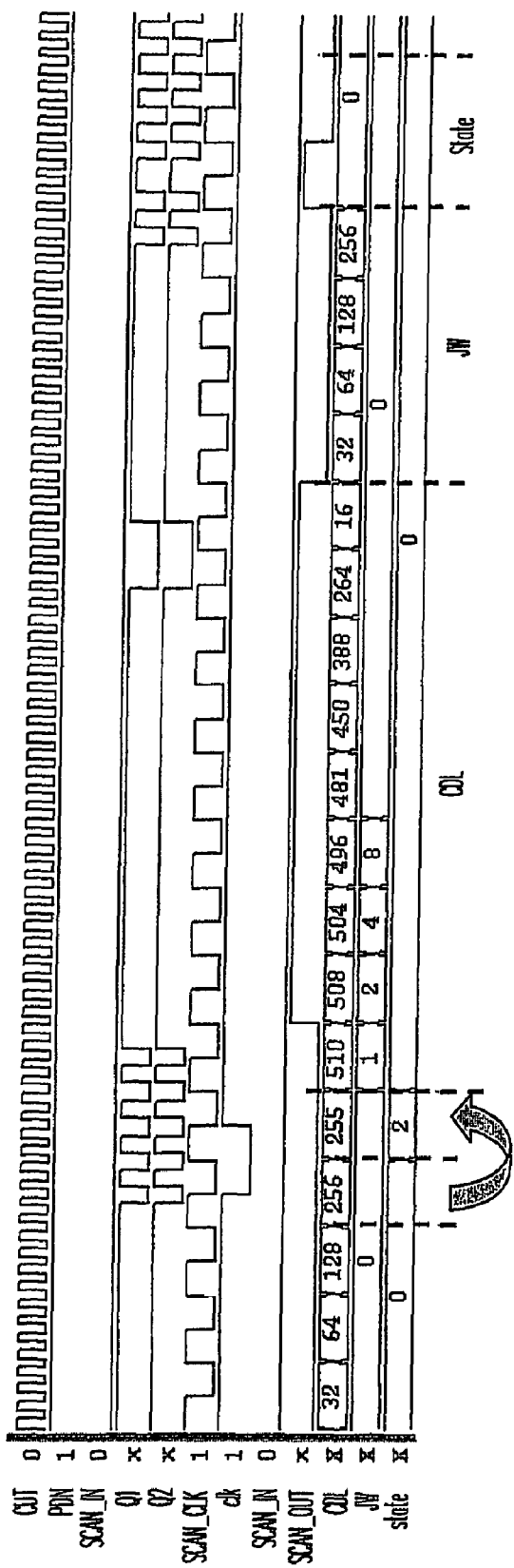
Figure 12B:
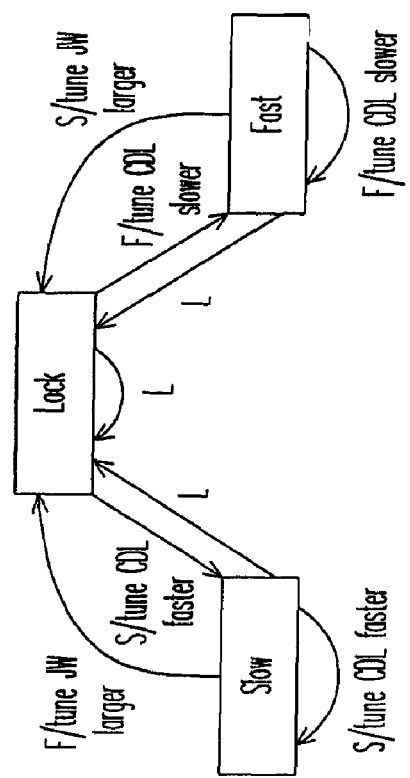

FIG. 12b shows another state transition diagram of FSM under digital part debug mode. In FIG. 12b, the control signal CDL is tuned faster, to verify whether the state of the FSM jumps to Slow state or not.

Second Embodiment

Figure 13:
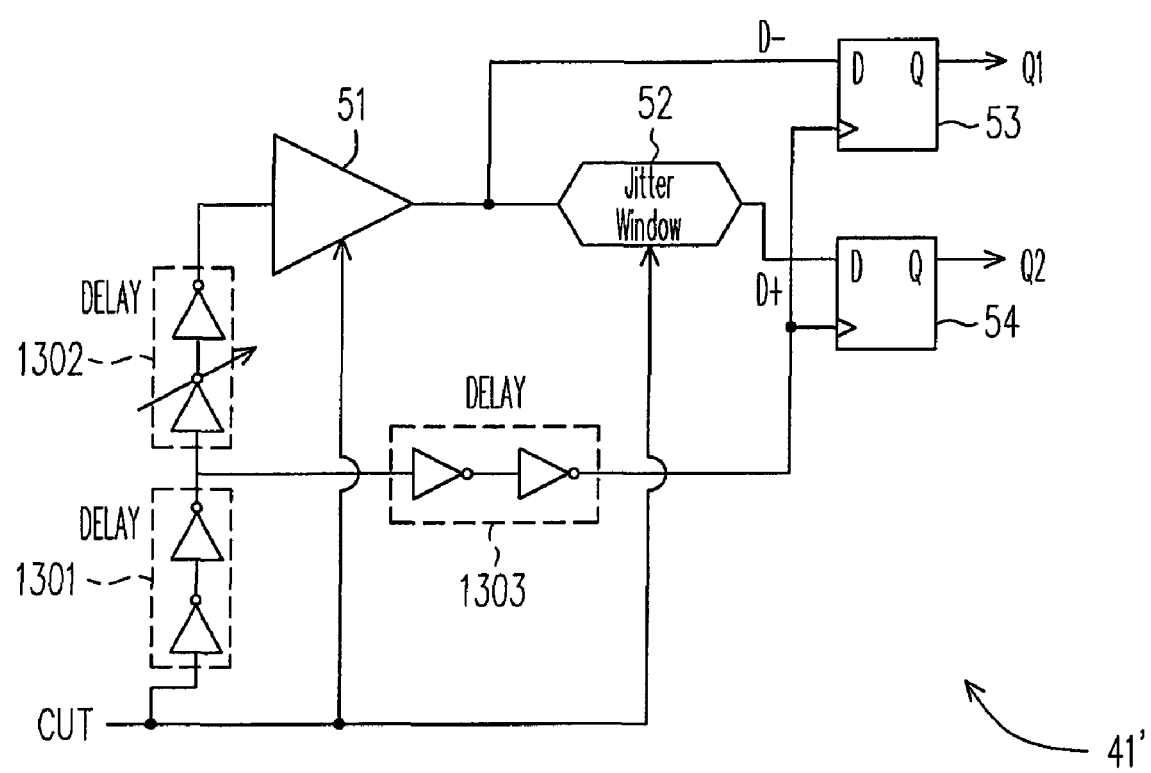
FIG. 13 shows an analog part 41' in the jitter measurement circuit according to a second embodiment of the invention.

FIG. 13 shows an analog part 41' in the jitter measurement circuit according to a second embodiment of the invention. As shown in FIG. 13, compared with the first embodiment, the analog part 41' further includes delay units 1301~1303. Delay units 1301~1303 can provide retiming and design flexibility in the jitter measurement circuit according to embodiments of the invention. When the clock CUT enters into the digital part, the clock CUT will suffer somewhat delay due to wire load etc in the digital part. The delay unit 1301 in the analog part 41' can ensure that the digital signals CDL and JW can control the analog controllable delay line 51 and the analog jitter window 52 in time. The delay unit 1302 can tune the clock CUT adaptively and make range of the clock CUT more flexible. Sometimes, the controllable delay line 51 and the jitter window 52 will drift due to PVT variations. So, the delay unit 1303 is to balance possible drift on the controllable delay line 51 and the jitter window 52. Therefore, design of the controllable delay line 51 and the jitter window 52 in the analog part will be more easily.

Other Examples of the Analog Part

Figure 14:
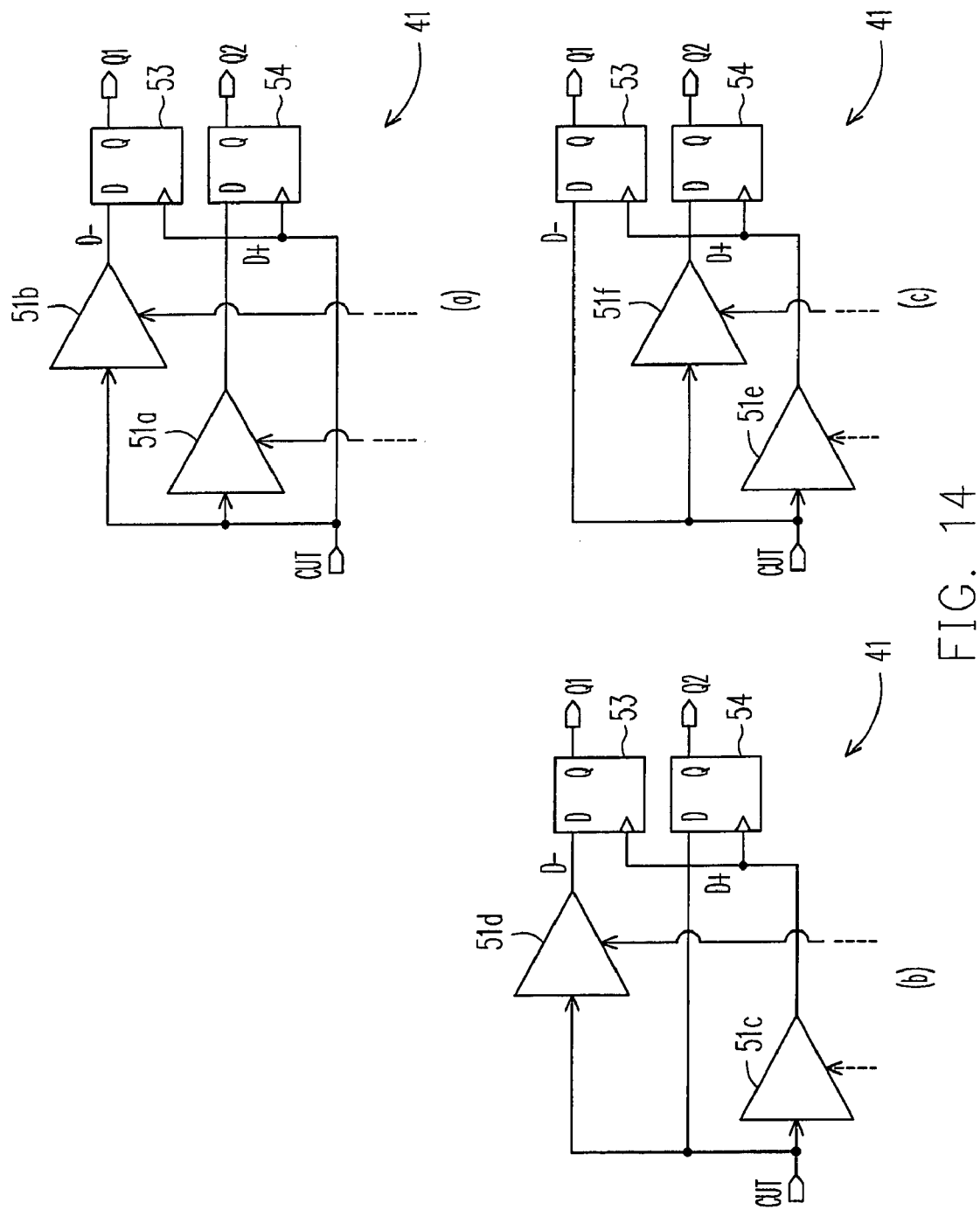
FIG. 14 show other example of the analog part in the jitter measurement circuit.

FIG. 14 show other example of the analog part in the jitter measurement circuit. The jitter window size in FIG. 14(a)~14(c) is the difference between CDL1 (51a, 51c, 51e) and CDL2 (51b, 51d and 51f). The width of the jitter window is used to detect peak to peak period jitter of the clock CUT. The peak to peak period jitter is detected by the clock under test itself without additional reference clock. Of course, the analog parts in FIG. 14(a)~14(c) may be used in the first and second embodiments of the invention.

This ASIC Jitter measurement circuit only needs one extra pin "PLLB_EN" for mass-production testing and has a little pin count because of no extra setup. The pins "SCAN_CLK", "SCAN_EN", "SCAN_IN", and "SCAN_OUT" can be share with other digital cores in the ASIC.

Therefore, in the embodiments of the invention, the peak to peak period jitter of output clock of PLL and that of recovered clock of CDR may be measured by the built-in jitter measurement circuit of ASIC. Because the jitter measurement circuit is on-chip, the high-end tester (ATE) cost is saved.

Even if suffered by variation tolerance, more accurate jitter measurement result may be achieved by adaptive delay line and jitter window tuning.

A novel implementation in PISO circuit can reduce 50% DFFs compare to traditional implementation and thus, this novel PISO circuit has low area overhead.

ASIC jitter measurement circuit according to embodiments of the invention provides functions of not only jitter measurement but also analog part debug and digital part debug. So, the calibration/debug time is reduced and the time-to-market is also reduced.

Adding delay units in the analog part can provide retiming and design flexibility in ASIC jitter measurement circuit.

FSM in the digital part has quite a few states, so easy scheme on CDL and jitter window tuning in analog part is achieved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A measurement circuit within an integrated circuit, for measuring an error value of a clock signal under test, the measurement circuit comprising:
 a first delay element, for delaying the clock signal under test to generate a first delayed clock signal;
 a second delay element, for delaying the clock signal under test to generate a second delayed clock signal;
 a condition indication element, coupled to the first and second delay elements, for indicating whether the error value of the clock signal under test is within a window value, the window value being corresponding to delays of the first and second delay elements; and
 a state machine, coupled to the condition indication element, for generating first and second control signals based on an indication signal from the condition indication element, the first and second control signals being for controlling the first and second delay elements;
 wherein if the indication signal indicates that the error value of the clock signal under test is not within the window value, the first and second control signals adjust the delayed clock signals of the first and the second delay elements and the window value;
 wherein the error value of the clock signal under test is measured based on the delayed clock signals of the first and the second delay elements and the window value.

2. The measurement circuit of claim 1, further comprising:
 an output circuit, coupled to the state machine, for scanning out the first and second control signals.

3. The measurement circuit of claim 2, further comprising:
 a clock switch circuit, receiving a scan clock signal, for switching one of the clock under test and the scan clock signal to the state machine and the output circuit.

4. The measurement circuit of claim 1, wherein the condition indication element includes:
 a first flip-flop, coupled to the clock signal under test; and
 a second flip-flop, coupled to the clock signal under test.

5. The measurement circuit of claim 4, wherein:
 the first delay element has:
 an input terminal, for receiving the clock signal under test; and
 an output terminal, coupled to the first flip-flop;
 the second delay element has:
 an input terminal, coupled to the output terminal of the first delay element; and
 an output terminal, coupled to the second flip-flop.

6. The measurement circuit of claim 4, wherein:
 the first delay element has:
 an input terminal, for receiving the clock signal under test; and
 an output terminal, coupled to the first flip-flop; and
 the second delay element has:
 an input terminal, for receiving the clock signal under test; and
 an output terminal, coupled to the second flip-flop.

7. The measurement circuit of claim 4, wherein:
 the first delay element has:
 an input terminal, for receiving the clock signal under test; and
 an output terminal, coupled to the first flip-flop and the second flip-flop; and
 the second delay element has:
 an input terminal, for receiving the clock signal under test; and
 an output terminal, coupled to the first flip-flop;
 wherein the clock signal under test further coupled to the second flip-flop.

8. The measurement circuit of claim 4, wherein:
 the first delay element has:
 an input terminal, for receiving the clock signal under test; and
 an output terminal, coupled to the first flip-flop and the second flip-flop; and
 the second delay element has:
 an input terminal, for receiving the clock signal under test; and
 an output terminal, coupled to the second flip-flop;
 wherein the clock signal under test further coupled to the first flip-flop.

9. The measurement circuit of claim 1, wherein the measurement circuit has a first debug mode to debug the first and second delay elements and a second debug mode to debug the state machine.

10. The measurement circuit of claim 1, wherein the error value is a peak-to-peak jitter value.

11. An integrated circuit, comprising:
 a clock generation circuit, for generating a clock signal under test; and
 a measurement circuit, coupled to the clock generation circuit, for measuring an error value of the clock signal under test, wherein the measurement circuit comprising:
 a delay stage, for delaying the clock signal under test to generate a plurality of delayed clock signals;
 a condition indication element, for receiving the plurality of delay clock signals from the delay stage to indicating whether the error value of the clock signal under test is within a window value, the window value being corresponding to delays of the delay stage; and
 a state machine, coupled to the condition indication element, for generating a control signal based on an indication signal from the condition indication element, the control signal being for controlling the delay stage;
 wherein if the indication signal indicates that the error value of the clock signal under test is not within the window value, the control signal adjust the delayed clock signals of the delay stage and the window value, so that the error value of the clock signal under test is to be within the window value, and the error value of the clock signal under test is measured based on the delayed clock signals of the delay stage and the window value.

12. The integrated circuit of claim 11, wherein the measurement circuit further comprising:
   an output circuit, coupled to the state machine, for scanning out the control signal; and
   a clock switch circuit, receiving a scan clock signal, for switching one of the clock under test and the scan clock signal to the state machine and the output circuit.

13. The integrated circuit of claim 11, wherein the condition indication element includes:
   a first flip-flop, coupled to the clock signal under test; and
   a second flip-flop, coupled to the clock signal under test.

14. The integrated circuit of claim 13, wherein the delay state includes:
   a first delay element, having an input terminal, for receiving the clock signal under test; and an output terminal, coupled to the first flip-flop; and
   a second delay element, having an input terminal, coupled to the output terminal of the first delay element; and an output terminal, coupled to the second flip-flop.

15. The integrated circuit of claim 13, wherein the delay state includes:
   a first delay element, having an input terminal, for receiving the clock signal under test; and an output terminal, coupled to the first flip-flop; and
   a second delay element, having an input terminal, for receiving the clock signal under test; and an output terminal, coupled to the second flip-flop.

16. The integrated circuit of claim 13, wherein the delay state includes:
   a first delay element, having an input terminal, for receiving the clock signal under test; and an output terminal, coupled to the first flip-flop and the second flip-flop; and
   a second delay element, having an input terminal, for receiving the clock signal under test; and an output terminal, coupled to the first flip-flop;
   wherein the clock signal under test further coupled to the second flip-flop.

17. The integrated circuit of claim 13, wherein the delay state includes:
   a first delay element, having an input terminal, for receiving the clock signal under test; and an output terminal, coupled to the first flip-flop and the second flip-flop; and
   a second delay element, having an input terminal, for receiving the clock signal under test; and an output terminal, coupled to the second flip-flop;
   wherein the clock signal under test further coupled to the first flip-flop.

18. The integrated circuit of claim 11, wherein the measurement circuit has a first debug mode to debug the delay stage and a second debug mode to debug the state machine.

19. The integrated circuit of claim 11, wherein the error value is a peak-to-peak jitter value.

* * * * *